US012635491B2

(12) United States Patent
Xie et al.

(10) Patent No.: US 12,635,491 B2
(45) Date of Patent: May 19, 2026

(54) REPLACEMENT BURIED POWER RAIL

(71) Applicant: International Business Machines Corporation, Armonk, NY (US)

(72) Inventors: Ruilong Xie, Niskayuna, NY (US); Stuart Sieg, Albany, NY (US); Somnath Ghosh, Clifton Park, NY (US); Kisik Choi, Watervliet, NY (US); Kevin Shawn Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 17/527,229

(22) Filed: Nov. 16, 2021

(65) Prior Publication Data

US 2023/0154783 A1     May 18, 2023

(51) Int. Cl.
| | |
|---|---|
| *H10W 20/00* | (2026.01) |
| *H10D 84/01* | (2026.01) |
| *H10D 84/03* | (2025.01) |
| *H10D 84/83* | (2025.01) |

(Continued)

(52) U.S. Cl.
CPC ........ *H10W 20/021* (2026.01); *H10D 84/013* (2025.01); *H10D 84/0149* (2025.01); *H10D 84/0158* (2025.01); *H10D 84/038* (2025.01); *H10D 84/834* (2025.01); *H10W 20/057* (2026.01); *H10W 20/20* (2026.01); *H10W 20/427* (2026.01)

(58) Field of Classification Search
CPC .............. H01L 23/5286; H01L 21/743; H10D 62/149–165; H10W 20/427; H10W 20/211
See application file for complete search history.

(56) References Cited

U.S. PATENT DOCUMENTS

| | | | |
|---|---|---|---|
| 9,570,395 B1 | 2/2017 | Sengupta | |
| 10,217,705 B1 * | 2/2019 | Qian | ................. H01L 21/76805 |
| 10,586,765 B2 | 3/2020 | Smith | |

(Continued)

FOREIGN PATENT DOCUMENTS

| | | |
|---|---|---|
| CN | 110800113 A | 2/2020 |
| CN | 113629012 A | 11/2021 |

(Continued)

OTHER PUBLICATIONS

Gupta, et. al., "Buried Power Rail Integration With FinFETs for Ultimate CMOS Scaling", https://ieeexplore.ieee.org/document/9257401, IEEE Transactions on Electron Devices, vol. 67, No. 12, Dec. 2020, pp. 5349-5354.

(Continued)

*Primary Examiner* — William B Partridge
*Assistant Examiner* — Alexandre X Ramirez
(74) *Attorney, Agent, or Firm* — Gavin Giraud

(57) ABSTRACT

Embodiments disclosed herein describe a semiconductor structure. The semiconductor structure may include a device region with a first source/drain (S/D) and a second S/D. The semiconductor structure may also include a buried power rail (BPR) under the device region. A critical dimension of the BPR may be larger than a distance between the first S/D and the second S/D. The semiconductor structure may also include a via-contact-to-buried power rail (VBPR) between the BPR and the S/D.

13 Claims, 12 Drawing Sheets

100

(51) Int. Cl.
    *H10W 20/20*        (2026.01)
    *H10W 20/41*        (2026.01)

(56)               References Cited

U.S. PATENT DOCUMENTS

| | | | |
|---|---|---|---|
| 10,636,739 | B2 | 4/2020 | Beyne |
| 10,700,207 | B2 | 6/2020 | Chen |
| 10,833,003 | B1 | 11/2020 | Chou |
| 2016/0343708 | A1* | 11/2016 | Park ................... H10D 30/6219 |
| 2019/0043804 | A1* | 2/2019 | Qian ................. H01L 21/76805 |
| 2020/0105671 | A1 | 4/2020 | Lai |
| 2020/0135634 | A1 | 4/2020 | Chiang et al. |
| 2020/0203276 | A1 | 6/2020 | Hiblot |
| 2020/0266169 | A1 | 8/2020 | Kang |
| 2020/0373301 | A1* | 11/2020 | Kim ........................ H10D 84/85 |
| 2020/0381352 | A1 | 12/2020 | Chou et al. |
| 2021/0028112 | A1* | 1/2021 | Kim ..................... H10D 84/038 |
| 2021/0082815 | A1* | 3/2021 | Doornbos ........... H01L 23/5286 |
| 2021/0098294 | A1 | 4/2021 | Smith |
| 2021/0118805 | A1 | 4/2021 | Sio |
| 2021/0202385 | A1 | 7/2021 | Huang |
| 2021/0280585 | A1 | 9/2021 | Jin |
| 2021/0336019 | A1* | 10/2021 | Su ...................... H10D 30/6735 |
| 2021/0336063 | A1* | 10/2021 | Liao ................... H10D 30/6713 |
| 2021/0351303 | A1* | 11/2021 | Ju ..................... H01L 21/76897 |

FOREIGN PATENT DOCUMENTS

| | | |
|---|---|---|
| EP | 3324436 B1 | 8/2020 |
| EP | 4434088 A1 | 9/2024 |
| JP | 2023-073971 A | 5/2023 |
| TW | 201914011 A | 4/2019 |
| TW | 202101666 A | 1/2021 |
| WO | 2023/088617 A1 | 5/2023 |

OTHER PUBLICATIONS

International Searching Authority, "Notification of Transmittal of the International Search Report and the Written Opinion of the International Searching Authority, or the Declaration", International application No. PCT/EP2022/078559, International Filing Date Oct. 13, 2022, Mailed on Feb. 7, 2023, 12 pages.

Prasad, et. al., "Buried Power Rails and Back-side Power Grids: Arm® CPU Power Delivery Network Design Beyond 5nm", https://ieeexplore.ieee.org/document/8993617, IEEE, IEDM19-449, Dec. 7, 2019, Accessed Feb. 13, 2023, pp. 19.1.1-19.1.4.

Japan Patent Office, "Notice of Reasons for Refusal" Mar. 31, 2026, 07 Pages, JP Application No. 2022-170972.

\* cited by examiner

P202101001US01

4/12

100

100

REPLACEMENT BURIED POWER RAIL

BACKGROUND

The present invention relates generally to the field of fabrication of semiconductor devices, and more particularly to forming a buried power rail with increased critical dimension by forming a dummy buried power rail with small dimensions at an earlier stage of fabrication, and increasing the dimensions after the dummy buried power rail is removed at later stage of fabrication.

In fabricating semiconductor devices, millions of devices can be located together on a single substrate. Useful control of these millions of devices relies on the application of electrical signals to specific devices while insulting the electrical signals from shorting to anything else (e.g., other devices). Within standard logic cells, power rails in back-end of line (BEOL) metal layers deliver current to source/drains that power the individual devices (e.g., transistors). The power rails carry a higher current than standard routing tracks/signal lines to maintain adequate power distribution targets, and therefore require a larger space in the cell. In many designs, a power rail can be four times larger than a normal routing line.

Reducing a lateral dimension of the power rails and extending a vertical dimension deeper into the cell can keep the total metal volume in the power rail high while making room for other components. Increasing the depth of the power rail, however, can cause higher via resistance, or can cause the signal lines to carry increased capacitance between tracks in the BEOL. Burying the power rails underneath a physical device (e.g. transistor) enables the depth of the power rail to be increased independent of the signal lines in the BEOL. Buried power rails (BPR) provide significantly lower resistance through the power rail without driving any negative impact to either via resistance or capacitance in the BEOL.

SUMMARY

According to one embodiment of the present invention, a semiconductor structure is disclosed. The semiconductor structure may include a device region with a first source/drain (S/D) and a second S/D. The semiconductor structure may also include a buried power rail (BPR) under the device region. A critical dimension of the BPR may be larger than a distance between the first S/D and the second S/D. The semiconductor structure may also include a via-contact-to-buried power rail (VBPR) between the BPR and the S/D.

According to one embodiment of the present invention, a method is disclosed. The method may include forming a dummy buried power rail (BPR) in an insulator layer between a first fin field-effect transistor (FET) and a second fin FET, forming a first source/drain (S/D) electrically connected to the first fin FET, and a second S/D electrically connected to the second fin FET, forming a via-contact-to-buried power rail (VBPR) that contacts a top surface of the dummy BPR and the first S/D, selectively etching the dummy BPR from a bottom surface opposite the top surface to form a BPR trench, widening the BPR trench, and metalizing the BPR trench to form a BPR.

According to one embodiment of the present invention, a semiconductor structure is disclosed. The semiconductor structure may include a back side power delivery network (BSPDN), a buried power rail (BPR) coupled to the BSPDN, a via-contact-to-buried power rail (VBPR) coupled to the BPR, wherein the BPR wraps around a bottom of the VBPR, a first source/drain (S/D) coupled to a middle of the VBPR, and a back-end-of-line layer coupled to a top of the VBPR.

DETAILED DESCRIPTION

Figure 1:
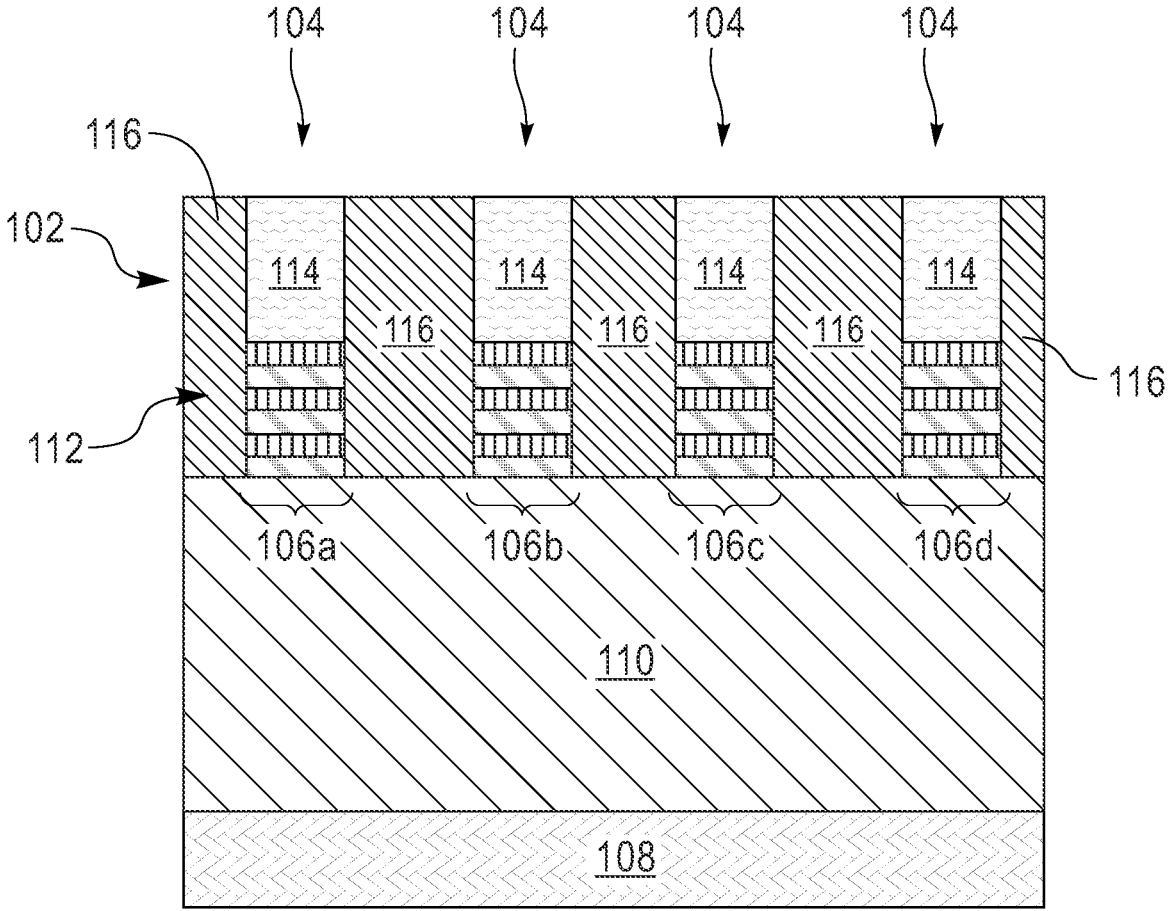
FIG. 1 is a schematic cross-sectional side view of a semiconductor structure, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

For integrated circuits, the masking, patterning, and etching of device components makes possible the fabrication of semiconductor devices at the micro and nano scale. As devices, components, and layers continually decrease in size and pitch, however, the etching techniques that have been used in the past can cause unintended consequences. As a specific example, buried power rails of a semiconductor structure can suffer from thermal instability caused during annealing processes. Any metal present in buried power rails can suffer issues during subsequent FEOL thermal processing, such as metal migration and metal diffusion, while the semiconductor structure is heated for the annealing. Additionally or alternatively, the semiconductor structure can stress and/or bow the wafer due to the expansion and contraction of the metals during heating. This unwanted stress/bowing could result in lithography misalignment errors in subsequent mask levels.

The devices and methods disclosed below address the problems associated with annealing the semiconductor structure and the buried power rail. Rather than forming the buried power rail with metals right after fin formation, therefore, the embodiments disclosed herein fabricate a dummy buried power rail, which is replaced later in the fabrication process by the metalized buried power rail.

FIG. 1 is a schematic cross-sectional side view of a semiconductor structure 100, in accordance with one embodiment of the present invention. The schematic view shows a of a row 102 that may include fins 104 fabricated as eventually becoming part of a field-effect transistor (FET) region (e.g., n-type FET (NFET) and p-type FET (PFET)). The illustrated embodiment of the semiconductor structure 100 includes four FET regions: a first NFET region 106a, a second NFET region 106b, a first PFET region 106c, and a second PFET region 106d. The fins 104 are fabricated on a substrate 108 and a BOX SiO2 layer 110, and include layers 112 for controlling signals through a device region of the semiconductor structure 100. The layers 112 may be fabricated by forming epitaxial semiconductor layers sequentially above the bottom-most semiconductor layer above the dielectric layer 110. In one embodiment, the starting wafer is a silicon-on-insulator (SOI) wafer. The substrate 108 can be silicon, and there's a BOX SiO2 layer 110 above the substrate 108. In certain embodiments, an additional silicon layer (not shown) may be fabricated above the BOX SiO2 layer 110. Firstly, the additional silicon layer above is thinned down to about 5-10 nm, followed by growing a SiGe layer and SiGe condensation process to convert the bottom most semiconductor layer above the BOX to SiGe. After that, the oxide above the SiGe is removed, followed by alternative layers of Si and SiGe layer growth. After that, a hard mask 114 is deposited. A patterning process is applied to the hard mask to define the active regions by conventional lithographical and etch processes. Then the area of the layers 112 that are not protected by the hard mask 114 may be etched away to form the fins 104. Though not illustrated, the layers 112 may be laterally cut in a direction perpendicular to the illustrated direction such that the semiconductor structure 100 may include several fins 104 along a column (i.e., into and out of the page). The open spaces between the fins 104 are then filled with dielectric 116, such as SiO2, or a combination of SiN and SiO2 layers. The semiconductor structure 100 may then be planarized, for example with chemical-mechanical planarization (CMP).

Figure 2:
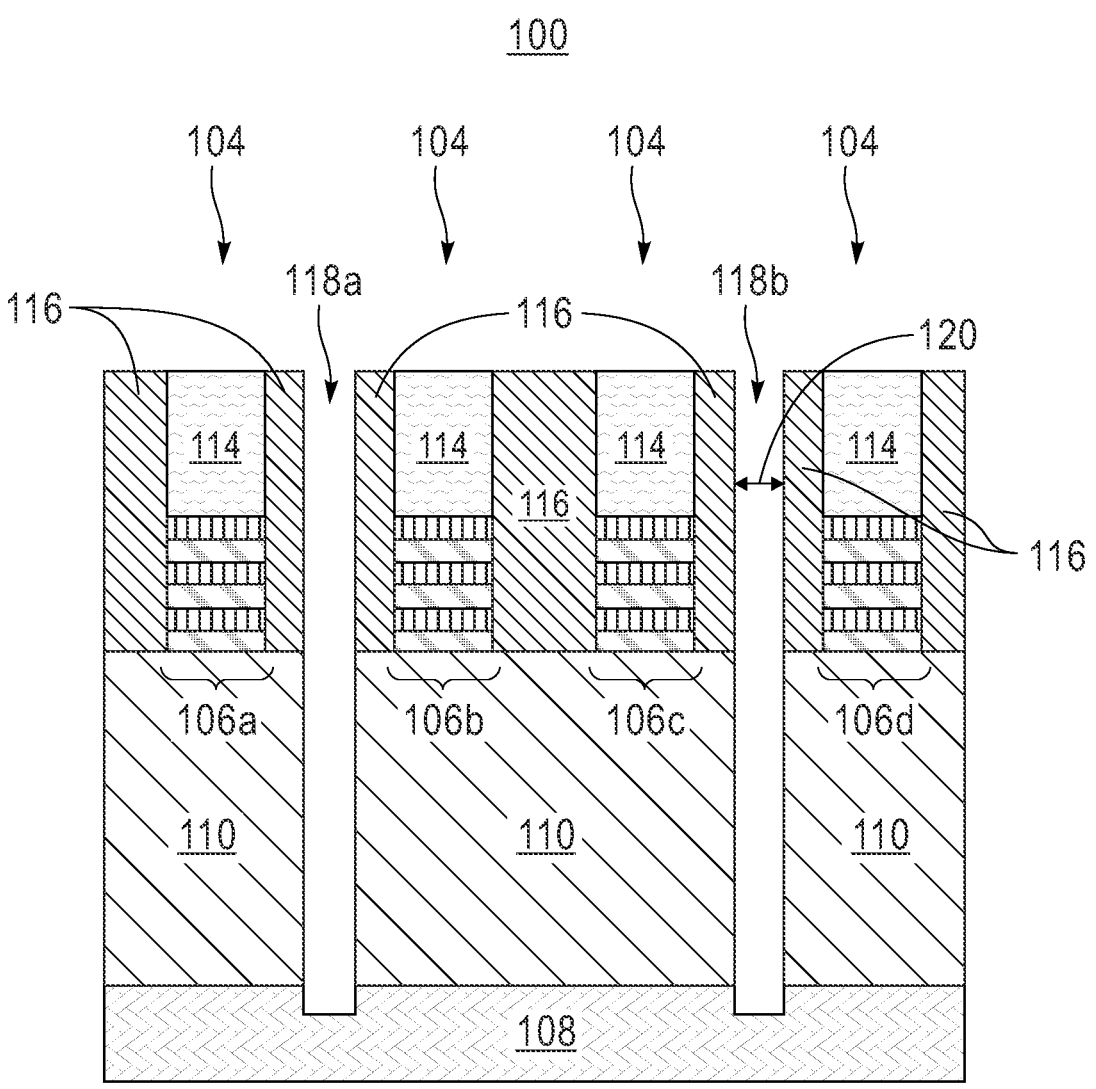
FIG. 2 is a schematic cross-sectional side view of the semiconductor structure of FIG. 1 at a subsequent fabrication stage, in accordance with one embodiment of the present invention.

FIG. 2 is a schematic cross-sectional side view of the semiconductor structure 100 of FIG. 1 at a subsequent fabrication stage, in accordance with one embodiment of the present invention. FIG. 2 shows buried power rail (BPR) trenches 118a, b etched through the length of the semiconductor structure 100 (i.e., into and out of the page). Since the BPR trenches 118a, b are continuous along the length of the semiconductor structure 100, the BPR trenches 118a, b may be patterned to a line shape which passed several, or all, of the fins 104 along the direction into and out of the page. The BPR trenches 118a, b may be patterned using a conventional lithographical and etch process, and may be patterned using a different hard mask (not illustrated). First, the hard mask may be patterned (e.g., using lithography and etch processes) so that the BPR trenches 118a, b may be subsequently formed through an etching process. In some embodiments, this etching can be performed using an anisotropic etch such as reactive ion etching (RIE). The BPR trenches 118a, b may be etched through the oxide 116, BOX SiO2 layer 110, and may partially cut into the substrate 108. The BPR trenches 118a, b do not require a large width 120. A narrower BPR trench 118a, b helps protect the fins 104 from being damaged by the BPR patterning process, even at worst case lithographic misalignment.

The BPR trenches 118a, b are formed between FET regions 106a-d. In the illustrated embodiment of FIG. 2, the first BPR trench 118a is formed between the first FET region 106a and the second FET region 106b, which are both NFET region. Likewise, the second BPR trench 118b is formed between the third FET region 106c and the fourth FET region 106d, which are both PFET region. Other embodiments may be conceived in which the BPR trench 118a, b are formed between FET regions that differ in device type.

Figure 3:
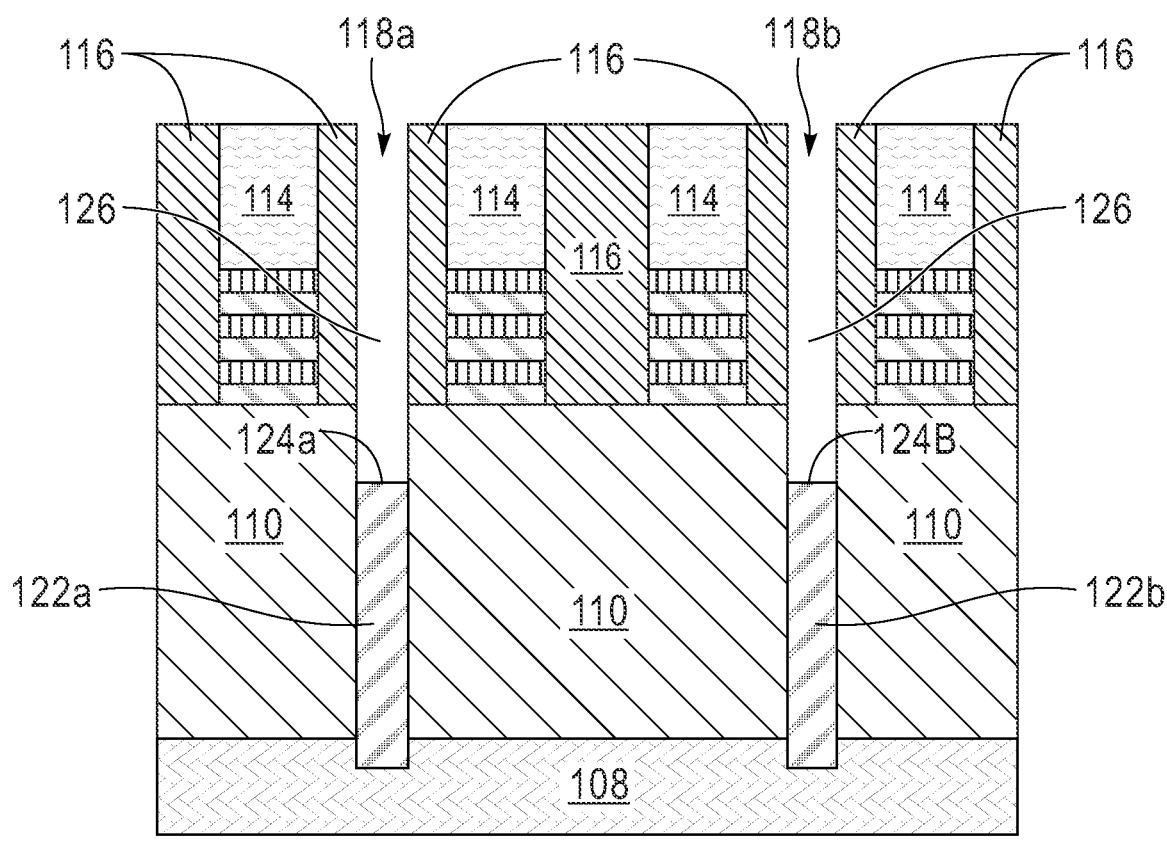
FIG. 3 is a schematic cross-sectional side view of the semiconductor structure of FIG. 1 at a subsequent fabrication stage, in accordance with one embodiment of the present invention.

FIG. 3 is a schematic cross-sectional side view of the semiconductor structure 100 of FIG. 1 at a subsequent fabrication stage, in accordance with one embodiment of the present invention. The semiconductor structure 100 includes a dummy buried power rail (BPR) 122a, b within each BPR trench 118a, b. The dummy BPR 122a, b may be formed of a sacrificial material, such as amorphous silicon, which can be selectively etched relative the BOX SiO2 layer 110, and the oxide 116. The dummy BPR 122a, b may be formed using chemical-vapor deposition (CVD), Plasma-enhanced chemical vapor deposition (PECVD), atomic layer deposition (ALD), or sputtering. After deposition, the dummy BPR 122a, b may be recessed partially so that a top surface 124a, b is at a height below the top of the BOX SiO2 layer 110. The dummy BPR 122a, b may be etched using a selective etch. Selective in the context of this application means that the etch process etches one material significantly faster than another material. In the instance illustrated in FIG. 3, the selective etch process etches the amorphous silicon of the dummy BPR 122a, b significantly faster than the exposed portions of the oxide 116, hard mask 114, or BOX SiO2 layer 110. The amount of recessing of the dummy BPR 122 may change depending on the embodiment, and a recession 126 that is larger or smaller than the illustrated embodiment will not diverge from the disclosed embodiments herein.

Figure 4:
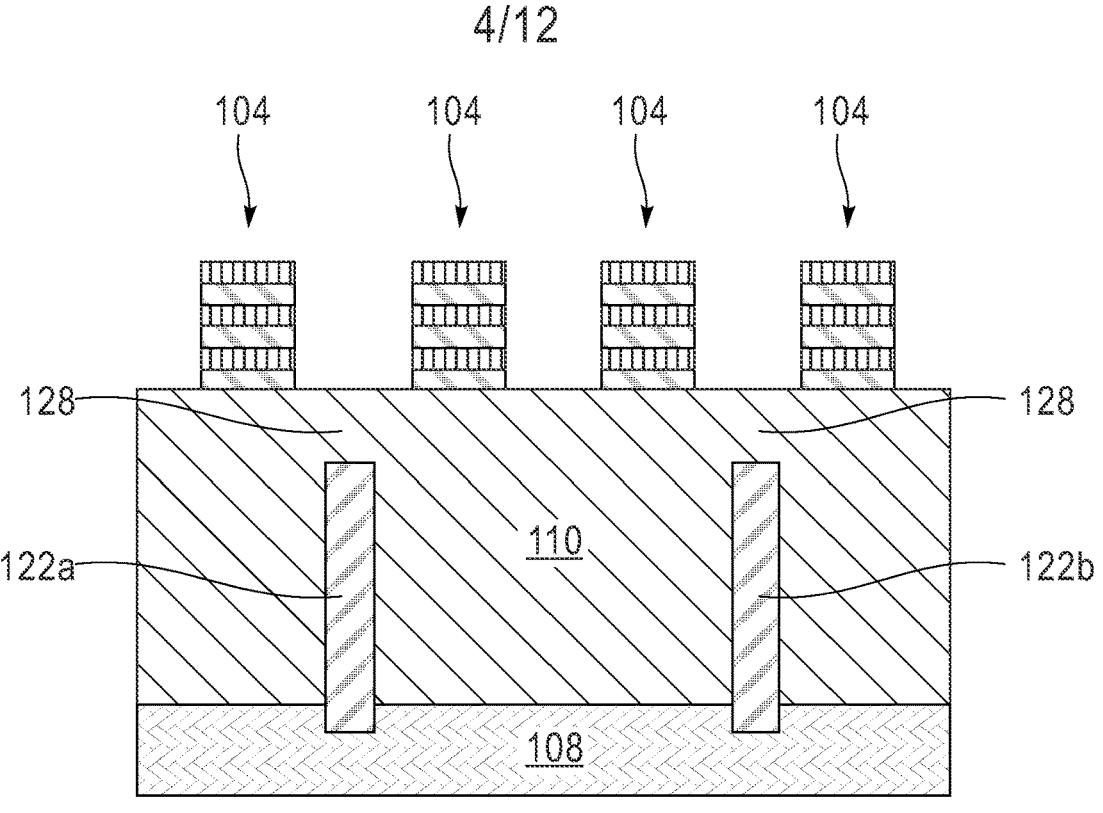
FIG. 4 is a schematic cross-sectional side view of the semiconductor structure of FIG. 1 at a subsequent fabrication stage, in accordance with one embodiment of the present invention.

FIG. 4 is a schematic cross-sectional side view of the semiconductor structure 100 of FIG. 1 at a subsequent fabrication stage, in accordance with one embodiment of the present invention. FIG. 4 shows the recession 126 filled with a fill 128 that covers the dummy BPR 122a, b. The fill 128 may include the same, or similar, material to the BOX SiO2 layer 110, and may fill the recession 126 to a top of the hard mask 114 so that the semiconductor structure 100 can then be planarized (e.g., CMP). Following planarization, a FIN reveal process is performed to selectively recess the dielectric 116, 128 (e.g., dilute hydrofluoric (DHF) or buffered oxide etch (BHF) wet etch; or SiCoNi/COR dry etching process can be used) such that the nanosheet stacks (comprising alternative SiGe and Si) are fully exposed while keeping the dummy BPR 122 covered. After that, the hard mask layer 114 can be selectively removed.

Figure 5A:
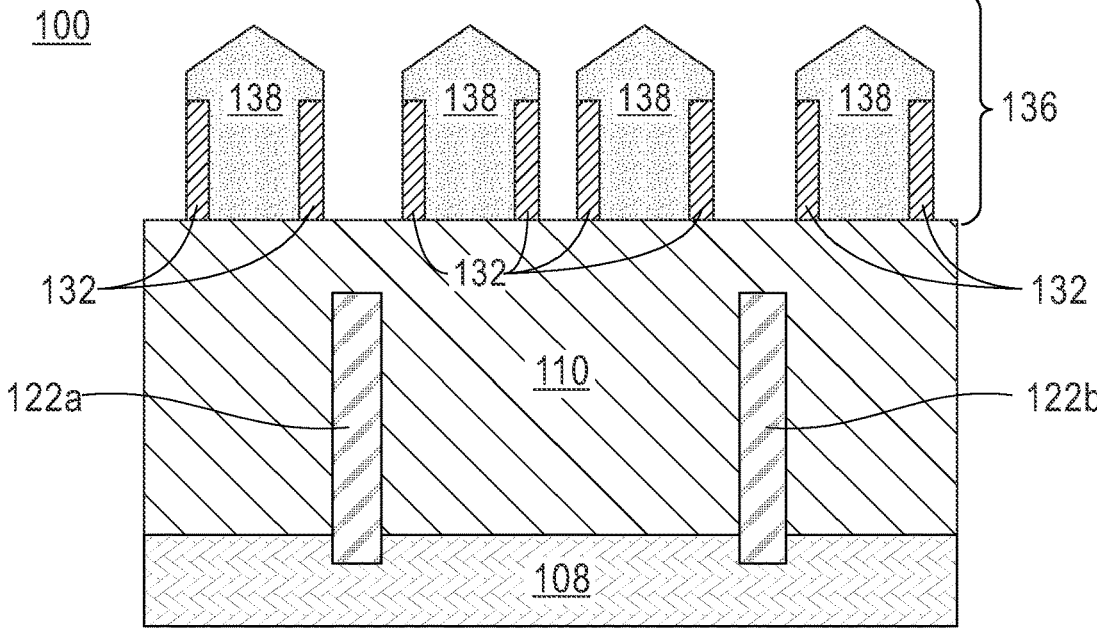
FIGS. 5A and 5B are schematic cross-sectional side views of the semiconductor structure of FIG. 1 at a subsequent fabrication stage, in accordance with one embodiment of the present invention.
Figure 5B:
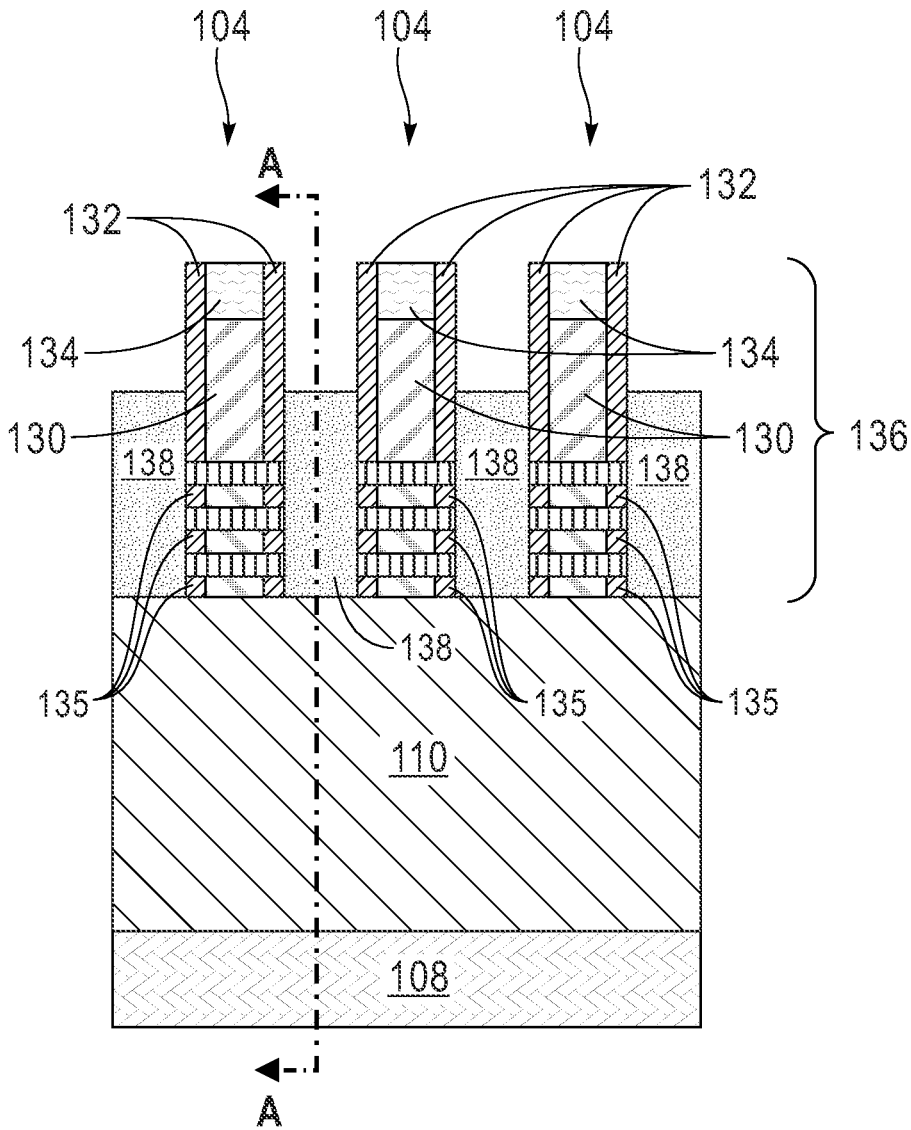

FIGS. 5A and 5B are schematic cross-sectional side views of the semiconductor structure 100 of FIG. 1 at a subsequent fabrication stage, in accordance with one embodiment of the present invention. FIG. 5A shows the cross-sectional location of the location illustrated in FIGS. 1-4, and FIG. 5B shows a second view angle that is perpendicular to the view of FIGS. 1-4. Line A-A in FIG. 5B shows the location of FIGS. 1-4, FIGS. 5A, and 6-13.

FIGS. 5A and 5B shows a process stage after forming a dummy gate 130 with a hard mask 134, spacers 132, inner spacers 135 and S/D epi formation in a device region 136. The gate, spacer and inner spacer formation can be achieved using conventional nanosheet fabrication process. Between the exposed nanosheets, the semiconductor structure 100 has source/drains (S/D) 138, that are formed epitaxially to form a crystalline layer onto the BOX SiO2 layer 110 and between the gates. Epitaxial layers of the S/Ds 138 may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor.

The epitaxial layers forming the S/Ds 138 may be grown using a suitable growth process, for example, CVD, liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 6:
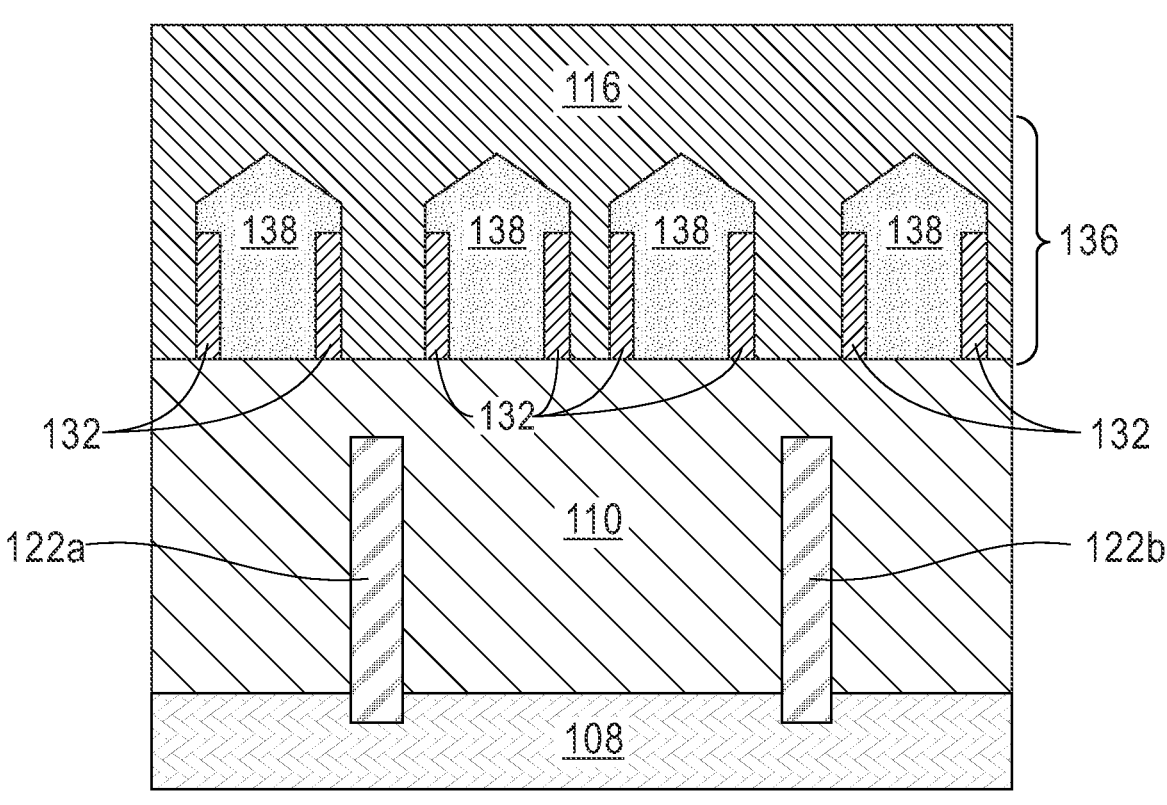
FIG. 6 is a schematic cross-sectional side view of the semiconductor structure of FIG. 1 at a subsequent fabrication stage, in accordance with one embodiment of the present invention.

FIG. 6 is a schematic cross-sectional side view of the semiconductor structure 100 of FIG. 1, in accordance with one embodiment of the present invention. FIG. 6 shows the device region 136 covered by an interlayer dielectric (ILD) 140. The device region 136 may have several stages completed before the ILD 140 is formed. After ILD 140 is formed, several conventional processes are further performed to fabricate the device. For example, gate cut and single diffusion break can be patterned and filled with dielectric, CMP process can be used to polish the ILD and remove the gate hard mask 134 to expose the dummy gate, and the dummy gate 130 and sacrificial SiGe between the Si sheets may be etched away and replaced by a high-k metal gate. The steps of fabricating the high-k gate dielectric and the S/Ds 138 may typically involve heat treatment for steps such as annealing, and the amorphous silicon of the dummy BPR 122a, b does not inhibit the annealing process by diffusing or by buckling. That is, unlike a metal BPR, the dummy BPR 122a, b does not have atoms the spread or diffuse during the annealing process. And since the coefficient of expansion is smaller and closer to the rest of the semiconductor structure 100 (and the wafer on which the semiconductor structure 100 is fabricated), the dummy BPR 122a, b will not cause stress or bow the semiconductor structure 100 during heating stages of the fabrication process.

Figure 7:
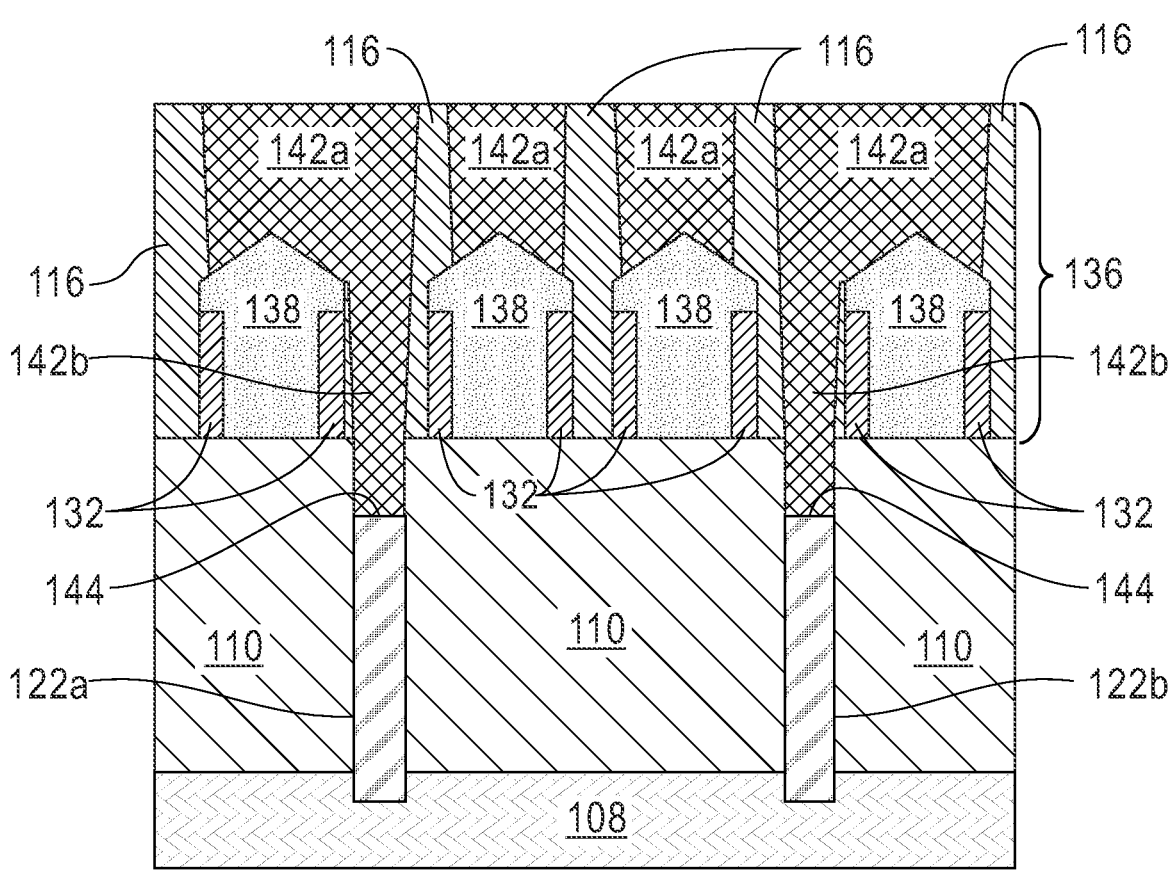
FIG. 7 is a schematic cross-sectional side view of the semiconductor structure of FIG. 1 at a subsequent fabrication stage, in accordance with one embodiment of the present invention.

FIG. 7 is a schematic cross-sectional side view of the semiconductor structure 100 of FIG. 1, in accordance with one embodiment of the present invention. FIG. 7 shows contacts 142*a, b* through which controlling signals are sent when the semiconductor structure 100 is finished. The contacts 142*a, b* include S/D contacts 142*a* and via-contacts-to-buried power rail (VBPRs) 142*b*. The contacts 142*a, b* are formed using conventional lithographic and etch processes through the ILD 140. In certain embodiments, openings for the S/D contacts 142*a* are formed with one mask, followed by a different mask for the openings of the VBPR 142*b*. In other embodiments, openings for the S/D contacts 142*a* and the VBPR 142*b* may be formed using the same mask. After the S/D contacts 142*a,b* are etched through the ILD 140 to expose the S/Ds 138 and/or the dummy BPR 122*a, b*, the openings are metalized to form the contacts 142*a, b*. The VBPRs 142*b* contact the dummy BPR 122*a, b* at a top surface 144.

Figure 8:
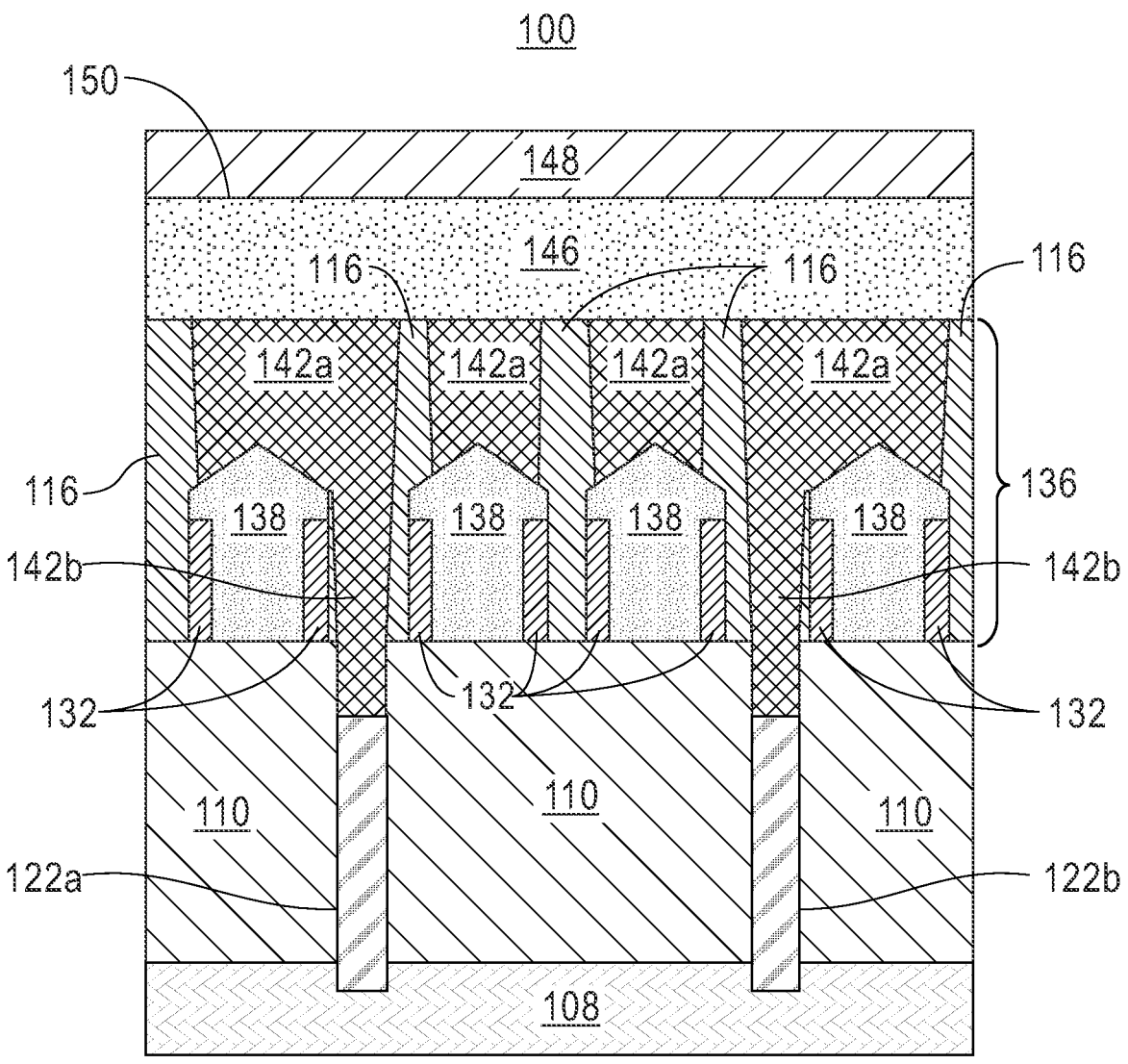
FIG. 8 is a schematic cross-sectional side view of the semiconductor structure of FIG. 1 at a subsequent fabrication stage, in accordance with one embodiment of the present invention.

FIG. 8 is a schematic cross-sectional side view of the semiconductor structure 100 of FIG. 1, in accordance with one embodiment of the present invention. FIG. 8 shows addition of middle-of-line (MOL) and/or back-end-of-line (BEOL) layers 146 and a carrier wafer 148 bonded to a top surface 150 of the BEOL layer 146. The MOL/BEOL layers 146 include the signal and power wires for controlling the transistors in the device region 136 through the contacts 142*a, b*. The MOL/BEOL layers 146 include contacts, insulating layers (dielectrics), metal levels, and bonding sites for chip-to-package connections. While the illustrated embodiment is not drawn to scale, modern processes for fabricating the MOL/BEOL layers 146 may include more than ten metal layers. The carrier wafer 148 is bonded to enable the wafer flip and backside processing, including the steps illustrated below. In certain embodiments, the carrier wafer 148 may be bonded to the BEOL layers 146 through dielectric-dielectric bonding or Cu—Cu bonding.

Figure 9:
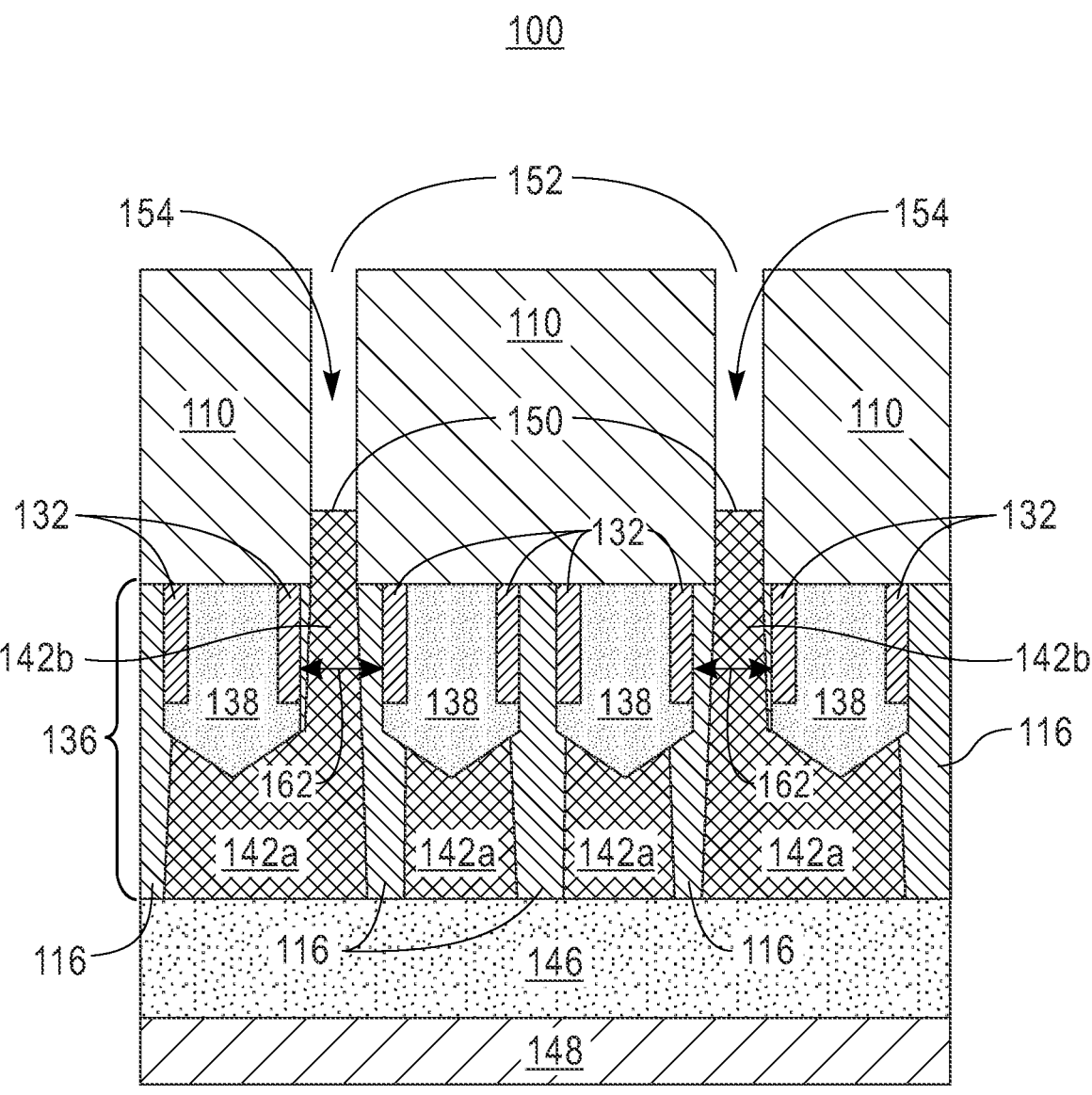
FIG. 9 is a schematic cross-sectional side view of the semiconductor structure of FIG. 1 at a subsequent fabrication stage, in accordance with one embodiment of the present invention.

FIG. 9 is a schematic cross-sectional side view of the semiconductor structure 100 of FIG. 1, in accordance with one embodiment of the present invention. FIG. 9 shows the semiconductor structure 100 flipped over to complete the steps for power delivery. The carrier wafer 148 supports the semiconductor structure 100 while the substrate 108 is removed from a bottom surface 152, which reveals the dummy BPRs 122*a, b*. The dummy BPRs 122*a, b* are then selectively etched from the bottom surface 152 opposite the top surface 150, leaving the BOX SiO2 layer 110 and the VBPR 142*b* intact and forming a BPR trench 154.

Figure 10:
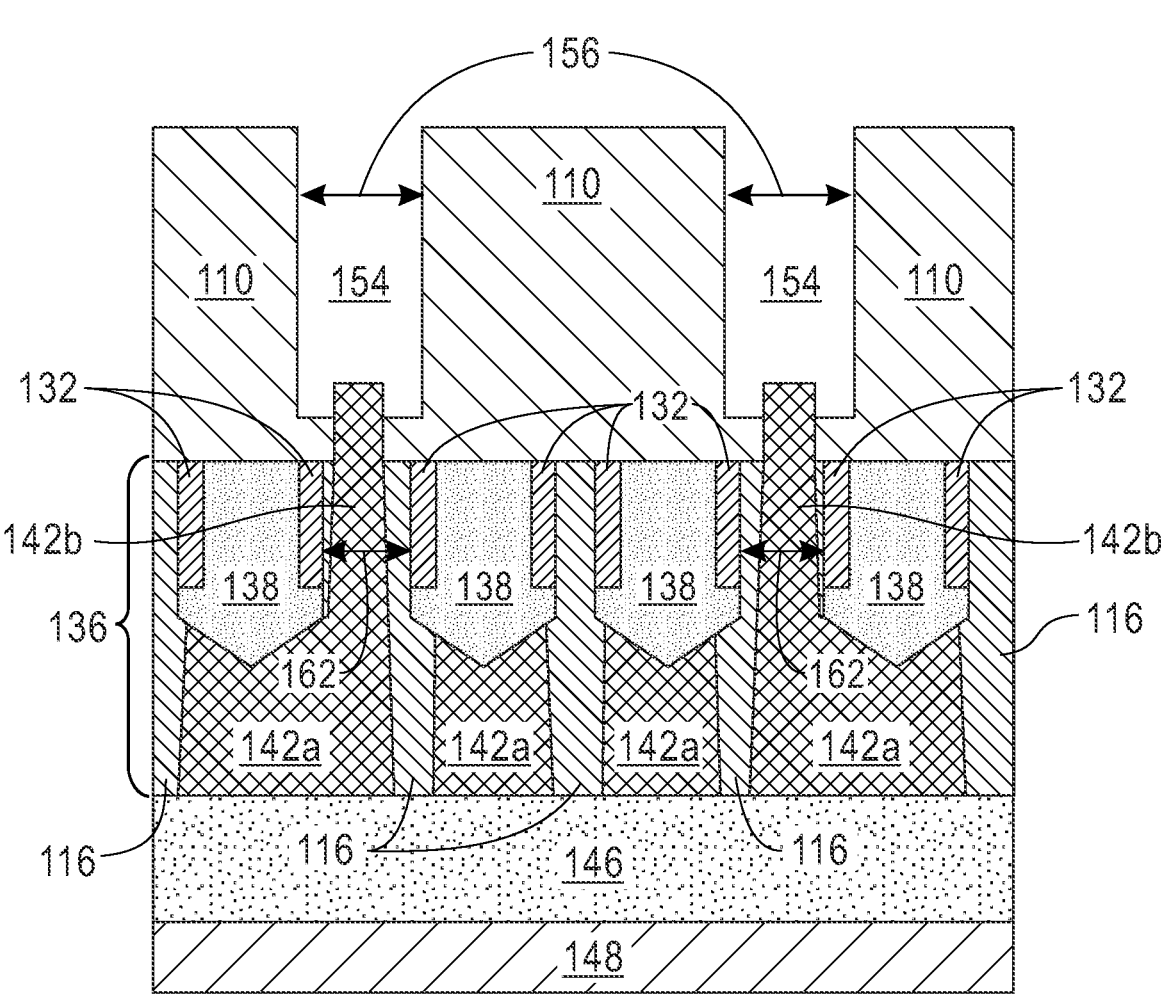
FIG. 10 is a schematic cross-sectional side view of the semiconductor structure of FIG. 1 at a subsequent fabrication stage, in accordance with one embodiment of the present invention.

FIG. 10 is a schematic cross-sectional side view of the semiconductor structure 100 of FIG. 1, in accordance with one embodiment of the present invention. FIG. 10 shows the BPR trench 154 being widened. The BPR trench 154 may be widened using an isotropic etch, which can be controlled to uniformly etch the surfaces inside the BPR trench 154. The etch process may be selective to the BOX SiO2 layer 110 so that the VBPR 142*b* is not affected, and protrudes into the BPR trench 154. A longer etch of the BPR trench 154 exposes more of the VBPR 142*b*, while a shorter etch will expose less of the VBPR 142*b*.

Figure 11:
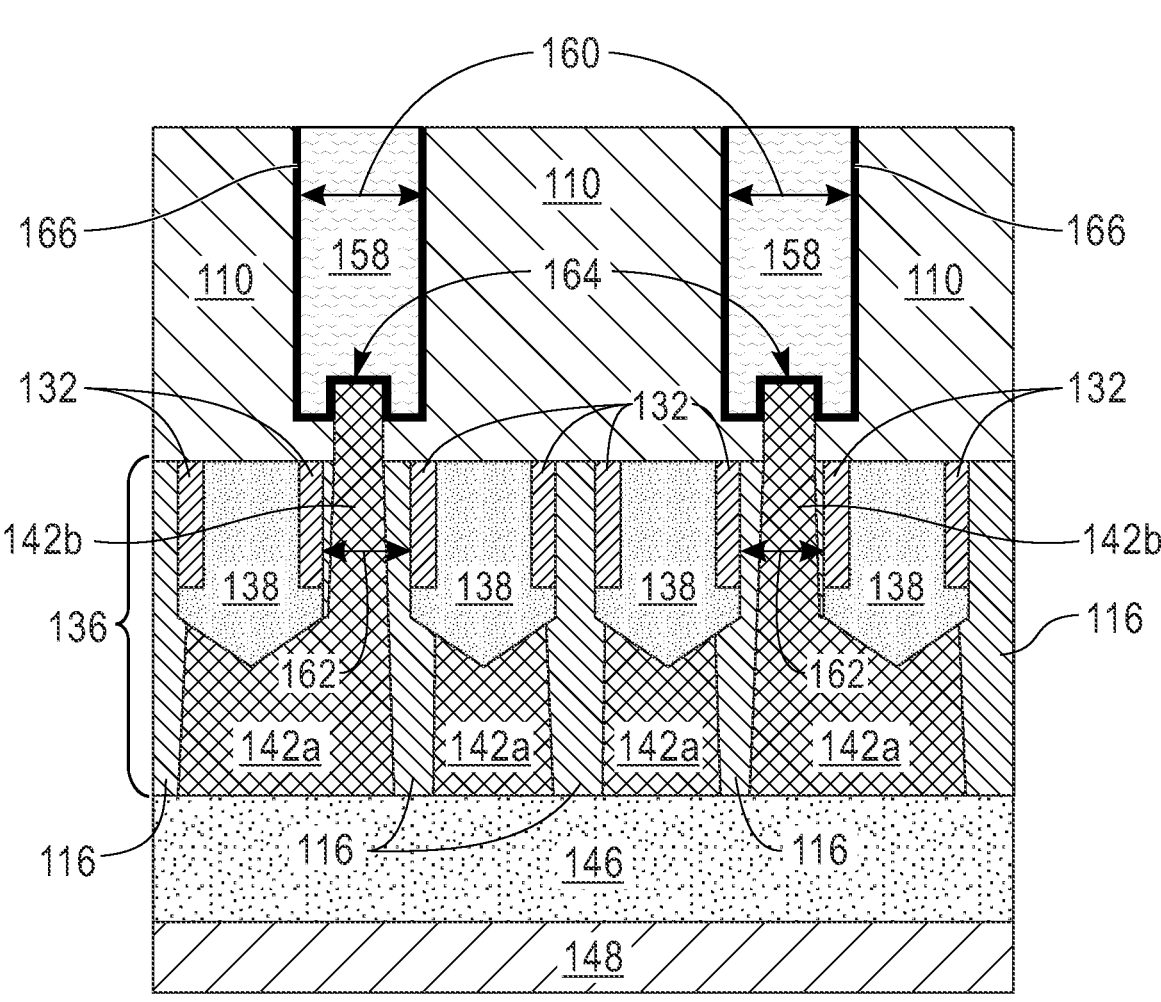
FIG. 11 is a schematic cross-sectional side view of the semiconductor structure of FIG. 1 at a subsequent fabrication stage, in accordance with one embodiment of the present invention.

FIG. 11 is a schematic cross-sectional side view of the semiconductor structure 100 of FIG. 1, in accordance with one embodiment of the present invention. FIG. 11 shows the BPR trench 154 filled to form a BPR 158. The BPR trench 154 may be filled with metals such as copper, cobalt, tungsten, and ruthenium. Prior to the metal fill, a metal adhesion liner 166 is deposited, such as a thin TiN or TaN liner. The BPR 158 is filled with metal or metals so that power may flow through with the least amount of resistance.

The BPR 158 is thus able to supply voltage to a number of S/Ds 138 along the length (i.e., in/out of the page) without costing a lot in terms of lost power. This can translate into cooler operation of the semiconductor structure 100 and longer battery life for device utilizing the semiconductor structure 100.

To further increase efficiency of the BPR 158, the embodiments disclosed herein have a critical dimension 160 that is greater than a distance 162 between the S/Ds 138 above the BPR 158. The critical dimension 160 is determined by the amount of etching of the BPR trench 154. The larger critical dimension 160 is possible due to the etching from the bottom surface 152 rather than trying to etch the BPR trench 154 before forming the contacts 142*a, b*.

The BPR 158 also forms a wrap-around contact 164 over the VBPR 142*b*, which increases the contact area between the VBPR 142*b* and BPR 158, which mitigates the concern that VBPR 142*b* bottom CD is too small that could lead a poor contact between VBPR 142*b* and BPR 158.

While certain embodiments may include the BPR 158 directly contacting the VBPR 142*b*, the illustrated embodiment includes an adhesion liner 166 between the BPR 158 and the BOX SiO2 layer 110. The adhesion liner 166 may be formed from titanium nitride and tantalum nitride, or similar materials that help the BPR 158 better adhere to the BOX SiO2 layer 110 without deteriorating, diffusing, or shorting to other components of the semiconductor structure 100. As illustrated, the adhesion liner 166 may wrap around the VBPR 142*b*, and the BPR 158 may wrap around the adhesion liner 166 rather than directly wrapping around the VBPR 142*b*.

Figure 12:
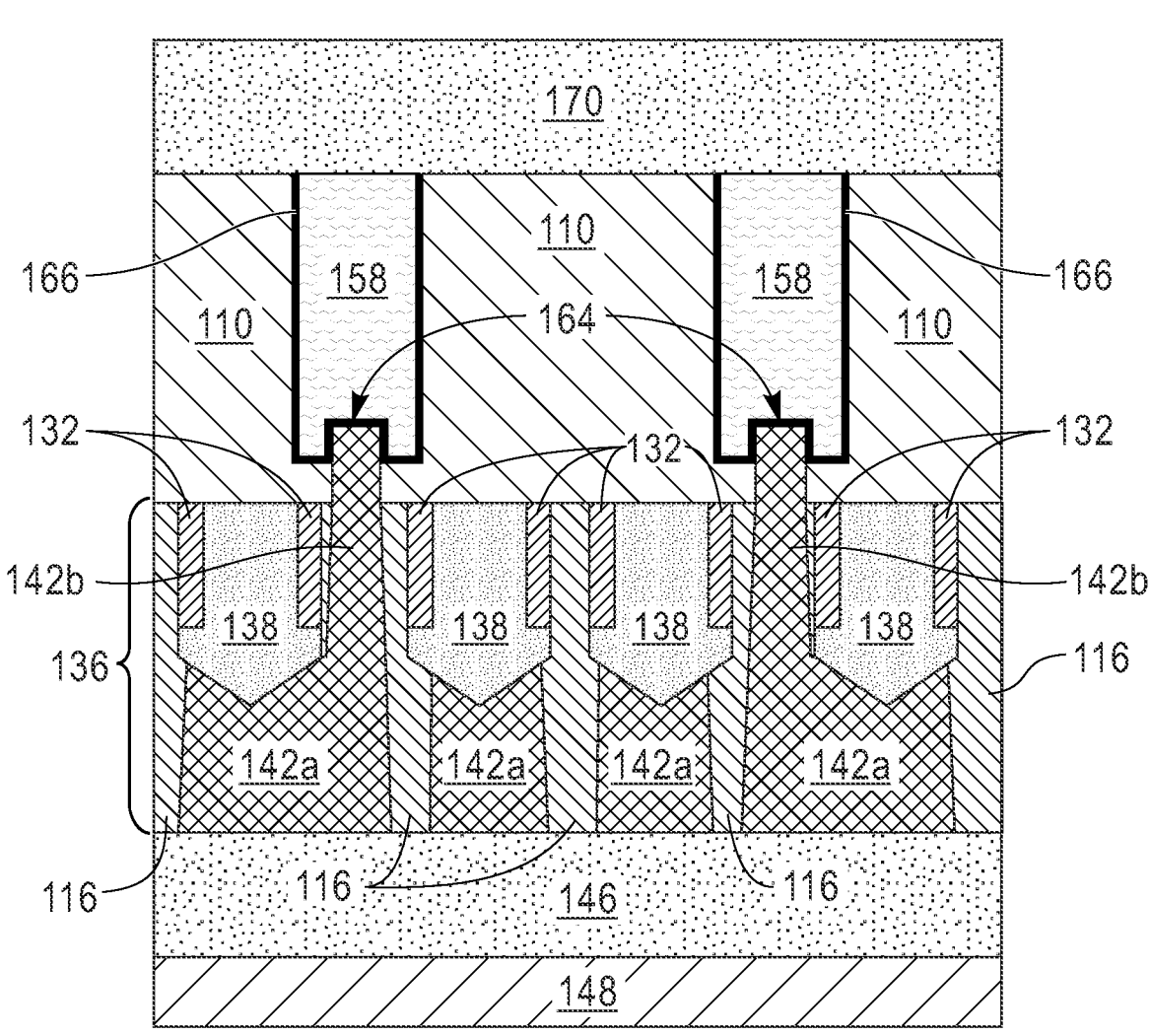
FIG. 12 is a schematic cross-sectional side view of the semiconductor structure of FIG. 1 at a subsequent fabrication stage, in accordance with one embodiment of the present invention.

FIG. 12 is a schematic cross-sectional side view of the semiconductor structure 100 of FIG. 1, in accordance with one embodiment of the present invention. FIG. 12 shows a back side power delivery network (BSPDN) 170 that coupled to the BPR 158 and contains the power delivery components needed for the semiconductor structure 100. The goal of the BSPDN 170 is to provide power and reference voltage to the S/Ds 138 and other devices in the device region 136, in the most efficient way. The BSPDN 170 is a network of interconnects that is separate from the MOL/BEOL layer 146 contained on the opposite side of the device region 136. Traditionally, the power components and the signals components are fabricated through back-end-of-line (BEOL) processing on the frontside (i.e., below the contacts 142*a, b* in the configuration illustrated in FIG. 12). Separating the BSPDN 170 to the backside (i.e., opposite the frontside so the device region 136 is between the frontside and the backside) enables direct power delivery to the device region 136, which enhances system performance, increases chip area utilization, and reduces complexity in the MOL/BEOL layers 146.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a device region comprising a first source/drain (S/D) and a second S/D;
a buried power rail (BPR) under the device region, wherein a critical dimension of the BPR is larger than a distance between the first S/D and the second S/D;
a via-contact-to-buried power rail (VBPR) between the first S/D and the second S/D directly contacting the BPR, the first S/D, and a back-end-of-line (BEOL) layer.

2. The semiconductor structure of claim 1, wherein the BPR wraps around the VBPR.

3. The semiconductor structure of claim 1, further comprising an adhesion liner between the BPR and an insulator.

4. The semiconductor structure of claim 3, wherein the adhesion liner wraps around the VBPR, and the BPR wraps around the adhesion liner.

5. The semiconductor structure of claim 3, wherein (i) the BPR comprises a selection from the group consisting of: copper, cobalt, tungsten, and ruthenium; and (ii) the adhesion liner comprises a selection from the group consisting of: titanium nitride and tantalum nitride.

6. The semiconductor structure of claim 1, further comprising a back side power delivery network (BSPDN) electrically coupled to the BPR.

7. The semiconductor structure of claim 6, wherein the device region is between the BSPDN and the BEOL layer.

8. A semiconductor structure, comprising:
a back side power delivery network (BSPDN);
a buried power rail (BPR) coupled to the BSPDN;
a via-contact-to-buried power rail (VBPR) between a first S/D and a second S/D and coupled to the BPR, wherein the BPR wraps around a bottom of the VBPR and a critical dimension of the BPR is larger than a distance between the first S/D and the second S/D;
wherein the first S/D is coupled to a middle of the VBPR; and
a back-end-of-line layer directly contacting a top of the VBPR.

9. The semiconductor structure of claim 8, further comprising a second S/D, wherein a critical dimension of the BPR is larger than a distance between the first S/D and the second S/D.

10. The semiconductor structure of claim 9, wherein the VBPR passes between the first S/D and the second S/D to connect to the BPR.

11. The semiconductor structure of claim 8, further comprising an adhesion liner between the BPR and an insulator.

12. The semiconductor structure of claim 11, wherein the adhesion liner wraps around the VBPR, and the BPR wraps around the adhesion liner.

13. The semiconductor structure of claim 11, wherein (i) the BPR comprises a selection from the group consisting of: copper, cobalt, tungsten, and ruthenium; and (ii) the adhesion liner comprises a selection from the group consisting of: titanium nitride and tantalum nitride.

* * * * *